US006942396B2

(12) United States Patent
Marion et al.

(10) Patent No.: US 6,942,396 B2
(45) Date of Patent: Sep. 13, 2005

(54) METHOD AND DEVICE FOR THE PASSIVE ALIGNMENT OF OPTICAL FIBERS AND OPTOELECTRONIC COMPONENTS

(75) Inventors: François Marion, Saint Egreve (FR); Régis Hamelin, Lyons (FR)

(73) Assignee: Commissariat a l'Energie Atomique, Paris (FR)

( * ) Notice: Subject to any disclaimer, the term of this patent is extended or adjusted under 35 U.S.C. 154(b) by 272 days.

(21) Appl. No.: 10/240,258

(22) PCT Filed: Mar. 27, 2001

(86) PCT No.: PCT/FR01/00922

§ 371 (c)(1), (2), (4) Date: Jan. 13, 2003

(87) PCT Pub. No.: WO01/73492

PCT Pub. Date: Oct. 4, 2001

(65) Prior Publication Data

US 2004/0037514 A1 Feb. 26, 2004

(30) Foreign Application Priority Data

Mar. 29, 2000 (FR) .......................................... 00 03950

(51) Int. Cl.[7] .............................................. G02B 6/36
(52) U.S. Cl. ...................................................... 385/90
(58) Field of Search ......................... 385/49, 52, 88–90

(56) References Cited

U.S. PATENT DOCUMENTS 5,434,939 A * 7/1995 Matsuda ...................... 385/88
5,496,769 A 3/1996 Marion et al. .............. 437/183
5,774,616 A * 6/1998 Matsuda ...................... 385/89
5,853,626 A 12/1998 Kato ......................... 264/1.25
5,883,996 A * 3/1999 Knapp et al. ................. 385/88
6,328,482 B1 * 12/2001 Jian ........................... 385/88

OTHER PUBLICATIONS

Cann et al., "Use of Silicon Vee Groove Technology In The Design and Volume Manufacture of Optical Devices", SPIE vol. 3004, pp 170–173.

Coldren et al., "Flip–Chip Bonded, Back–Emitting, Microlensed Arrays of Monolithic Vertical Cavity Lasers and Resonant Photodetectors", 1999, IEEE, Electronic Components and Technology Conference, pp 733–740.

Hall et al., "VCSEL Electrical Packaging Analysis nd Design Guidelines for Multi–GHz Applications", Aug., 1997, IEEE, Transactions on Components, Packaging, and Manufacturing Technology—Part B, vol. 20, No. 3, pp 191–196.

Louderback et al., "Low Cost, Free–Space Optical Interconnects", Dec. 1998, Compound Semiconductor, pp. 11–13.

* cited by examiner

*Primary Examiner*—Thien M. Le
*Assistant Examiner*—April Taylor
(74) *Attorney, Agent, or Firm*—Thelen Reid & Priest LLP

(57) ABSTRACT

Process and device for the passive alignment of optical fibers and optoelectronic components.

According to the invention, at least one component comprising a substrate layer, a first layer and a second layer comprising at least one active zone (16) is used, the component is placed on the support, the second layer facing it, the component is at least partially coated with a coating material (30) from the support to a level beyond that of the first layer and selectively up to this level at least a part of the substrate facing the active zone is removed in order to reveal a cavity (38) able to accept one end of at least one optical fiber (32).

19 Claims, 7 Drawing Sheets

METHOD AND DEVICE FOR THE PASSIVE ALIGNMENT OF OPTICAL FIBERS AND OPTOELECTRONIC COMPONENTS

This application is a national phase of PCT/FR01/00922 which was filed on 27 Mar. 2001, and which was not published in English.

TECHNICAL FIELD

The present invention concerns a process and a device that allows the passive alignment of at least one optical fibre and at least one optoelectronic component with the aim of assembling them precisely.

The optoelectronic component could be a photodetector or a photoemitter (for example of the diode or laser type).

The invention applies in particular to the assembly of at least one optical fibre and at least one VCSEL, i.e. a vertical cavity surface emitting laser, or planar photodetector.

The invention has particular application in the assembly of optoelectronic components with high throughput optical fibre links (for example optical fibre cables fitted with connectors).

Equally, the invention applies to parallel assemblies of a number of optical fibres and a number of optoelectronic components laid side by side.

Other particular applications of the invention are as follows:

- manufacture of an integrated optical cable using a single core or multiple cores, i.e. a cable comprising end connectors and control circuits respectively-integrated into these end connectors,
- optical interconnection on a card using at least one optical fibre connecting two zones of the card,
- any application requiring a coupling between a fibre, an optical circuit and a control circuit.

BACKGROUND OF THE INVENTION

The coupling of an optical fibre and an emitter of laser light requires an accurate alignment between this component and the fibre, usually an alignment close to 10 μm, the accuracy required being even higher for single-mode optical fibres. To couple an optical fibre and a detector component (for example, a VCSEL operating as a photodetector) the same accuracy as for the coupling between the fibre and emitter component is required.

Considering the example of coupling an optical fibre and a laser emitter, a commonly used alignment technique consists of actively aligning the fibre and laser emitter, the latter being powered in order to produce a laser beam. Once the alignment is produced, the fibre is attached to the laser emitter by soldering or using an adhesive.

This active alignment technique leads to a high cost figure for the assembly thus obtained.

For this reason a passive alignment technique has been conceived. In this case, the relative positioning and then the attachment of the fibre and the emitter or receiver component is achieved without voltage (for the component), nor luminous flux. The fibre and the component are locked mechanically with respect to each other then precisely connected.

There exists for example a well-known passive assembly technique for joining an optical fibre and a laser rod that uses lateral emission. This assembly is shown schematically in FIG. 1.

An alignment support 2 in the shape of a V groove, usually made from silicon 4 is used to locate the optical fibre 6. This latter is bonded into the V shaped silicon and the laser rod 8 is precisely hybridised to the fibre using the alignment support.

This technique allows accuracies of the order of 1 μm to 5 μm to be achieved.

As regards this technique there is for example a description [1] that, as with the other documents referred to later, is listed at the end of this description.

The technique described earlier, using a V groove in silicon, is applicable for the assembly of an optical fibre and a laterally emitting laser but not for the assembly of a fibre and a VCSEL device that emits light from a face.

However, this technique has been modified in order to enable such an assembly to be performed. In this case, mechanical or optical means are used to place the VCSEL device at 90° to the optical fibre.

This subject is referred to as an example in document [2].

However, this technique alters the passive alignment and requires the use of complex operations, in particular supplementary alignment means.

Similar disadvantages are also apparent when it is required to connect an optical fibre and a VCSEL as described in document [5] or a VCSEL able to emit light from its inner or rear face, as described in documents [3] and [4].

In this latter case, it is worth noting that it is easier to refer to a vertical cavity laser or VCL since such a laser emits light across its substrate rather than from an upper or forward face.

Also to be noted is the flip chip technique that is described in document [3] in order to connect the VCL device to a silicon control circuit.

DESCRIPTION OF THE INVENTION

The present invention is aimed at resolving the problem of aligning an optical fibre and an optoelectronic emitter or receiver, this alignment being passive (i.e. achieved without the operation of the component) and obtained more easily but just as accurately as other known passive alignment technique.

The present invention seeks to resolve this problem in particular for a planar optoelectronic component such as a vertical emission laser, which operates (emitter or receiver) using one of its larger faces and not the lateral face.

More precisely, the object of the present invention is a process to align at least one optical fibre and at least one optoelectronic component with at least one active zone, this process being characterised by:

- the use of one optoelectronic component comprising a substrate layer, a first layer that remains when substrate has been removed and a second layer comprising at least one active zone, this active zone opposite a portion of the first layer and used to emit or detect a light beam across this portion, the first layer being transparent to this light beam,
- the optoelectronic component is placed on the support so that the second layer is opposite this support,
- the optoelectronic component is coated, at least partially, using a coating that extends from the support to a level beyond the first layer, and
- at least a part of the substrate up to the first layer is selectively removed as well as the coating material that may be covering this part of the substrate, this removal being opposite the active zone, and producing a cavity opposite this active zone capable of accepting one end of at least an optical fibre and allowing it to be aligned with an optoelectronic component by insertion of the fibre end into the cavity.

The removal of at least one part of the substrate may be made by an etching technique, where the first layer thus forms an etching stop layer.

The support could be an electrical circuit with the optoelectronic component connecting into it.

Preferably, after insertion of the end of the optical fibre into the cavity, the optical fibre is locked in place with respect to the optoelectronic component.

According to a first embodiment of the process of the invention, before placing the optoelectronic component on the support it is bounded by perpendicular facets in the first and second layers, those facets surrounding a substrate area where the cavity is later to be made.

According to a second embodiment of the invention, before placing the optoelectronic component onto the support, a channel is made around the active zone, from the free surface of the second layer into the substrate, the walls of the channel that are the closest to the active area forming an area in the substrate where the cavity will later be made.

Preferably, the channel is bounded by two walls that become closer together towards the bottom of the channel.

According to a first embodiment of the invention, the optoelectronic component is completely covered using a coating material, which is then removed as well as the substrate to a level beyond that of the first layer.

According to a second embodiment of the invention, the optoelectronic component is partially covered using a coating material that extends to a level beyond that of the first layer.

According to a first example, the optoelectronic component comprises a single active zone located on the center of this component, the substrate, when viewed in a plane parallel to the first and second layers, forms a square with the length of the side equal to the diameter of the optical fibre, all the substrate is removed from the component as far as the first layer of the component to create a cavity and the end of the optical fibre is inserted into the cavity which provides a guide for this fibre end.

According to a second example, the optoelectronic component comprises a number of active zones, the whole of the component substrate is removed down to the first layer in order to create a cavity into which the ends of a collection of parallel optical fibres are inserted, held together firmly by a clamping arrangement, the cavity being able to guide this clamping arrangement, the active zones being configured to be respectively coupled optically to the ends of the optical fibres.

According to a third example, the optoelectronic component comprises several active zones, several portions of the component substrate are removed to create a number of parallel cavities respectively opposite the active zones, these cavities able to guide the ends of a collection of optical fibres, the active zones being configured to be respectively coupled optically to the ends of the optical fibres.

In the present invention, an optoelectronic component comprising a number of active zones intended to be coupled optically to the ends of a collection of optical fibres clamped firmly to each other, can be used.

Equally, a number of optoelectronic components placed on a single support can be used.

In the invention, each optoelectronic component may be a vertical cavity surface emitting laser.

A further object of the present invention is a passive alignment device for at least one optical fibre and at least one optoelectronic component, this device being characterised in that the optoelectronic component comprises a layer and, within this layer, at least one active zone, this active zone being capable of emitting or detecting a light beam, the optoelectronic component being placed on a support in order that the layer is opposite this support, moreover, this component comprising at least one cavity, this cavity being opposite the active zone and capable of accepting the end of at least one optical fibre and to allow the alignment of this optical fibre and the optoelectronic component by inserting its end into the cavity, thus coupling optically this end and the active zone.

According to a first embodiment of the device covered by the invention, the optoelectronic component comprises a single active zone and a single cavity centered on this active zone, this cavity being capable of guiding the end of the optical fibre in order to create the optical coupling between this end and the active zone.

According to a second embodiment, the optoelectronic component comprises a number of active zones and a number of parallel cavities centered respectively on these active zones, these cavities being capable of guiding the ends of a number of optical fibres to form the optical coupling respectively between these latter and the active zones.

According to a third embodiment, the optoelectronic component comprises a number of active zones and a single cavity opposite the active zones, this cavity being capable of guiding a clamping arrangement of the parallel ends of the optical fibres, that are to be respectively coupled optically to the active zones.

BRIEF DESCRIPTION OF THE DRAWINGS

The present invention will be easier understood by reference to the following descriptions of examples of the embodiments, given as examples only and non-exhaustive, represented by the appended drawings in which.

DETAILED DESCRIPTION OF THE PARTICULAR EMBODIMENTS

Figure 1:
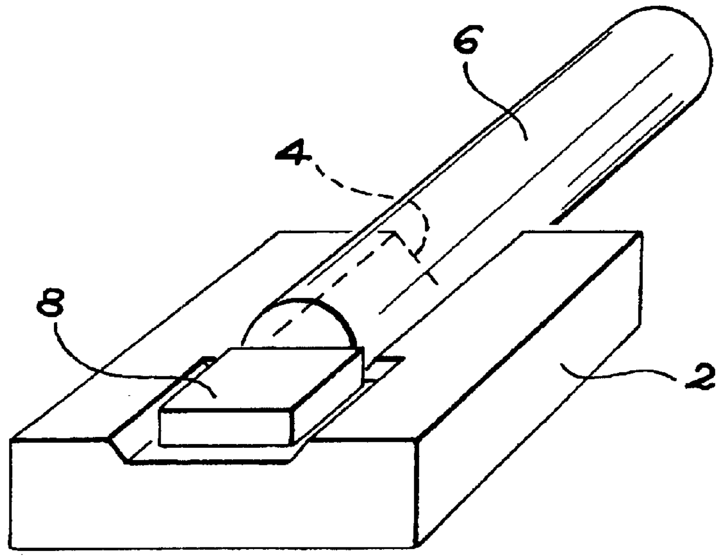
FIG. 1 is a schematic view of a known assembly of an optical fibre and a laser rod as already described.
Figure 2:
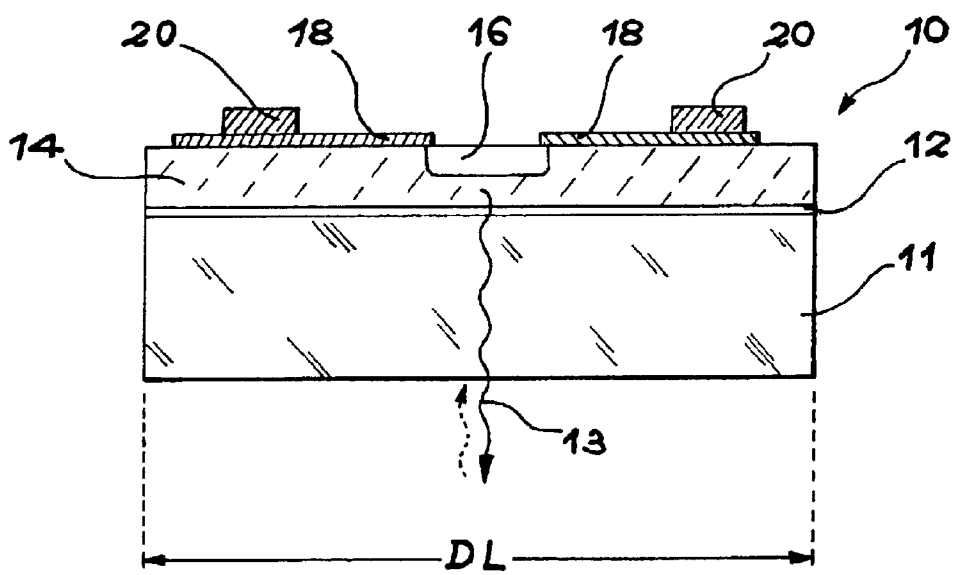
FIGS. 2 to 5 show schematically the various stages of a process according to the invention

There follows the manufacture of a vertical mechanical alignment guide using an optoelectronic component 10 that is shown schematically in longitude section in FIG. 2, in such a way that an optical fibre and the component can be aligned without the use of an alignment support or additional alignment fixture.

The following describes the manufacturing stages of an assembly between an optical fibre and this component, which, for the purpose of this example is a VCSEL.

In a first stage the optoelectronic component 10 is manufactured. This component comprises

- a semiconductor substrate 11,
- a layer 12 which is produced on the substrate and comprises an etch stop layer the properties of which are described later, this layer 12 furthermore being transparent to the light 13 that is liable to be emitted or detected by the component, and
- a semiconducting layer 14 produced on this etch stop layer 12, this layer 14 comprising a epitaxial layer in which the active element or active zone 16 of the component is produced, being the zone used to emit or detect the light.

The layer 14 is also transparent to the light emitted or detected by the component.

The component 10 comprises moreover one or several layers 18 of interconnects that enable the component to be connected to a control circuit using the flip chip method.

These interconnect layers 18 can be seen in FIG. 2 on either side of the active zone 16. Also seen are the electrical conducting contacts 20 formed on the layers 18 that enable the biasing of the component so that it emits light, when the VCSEL is a light emitter, or enables the biasing of the component and recovery of electrical signals when the component is a light receiver.

In fact, this component is manufactured in numbers using the same semiconducting wafer and each component is cut into the shape of a square with side length of DL centered on zone 16 (FIG. 2). This DL dimension is necessary because of the diameter of the optical fibre to be connected to the component 10.

Figure 3:
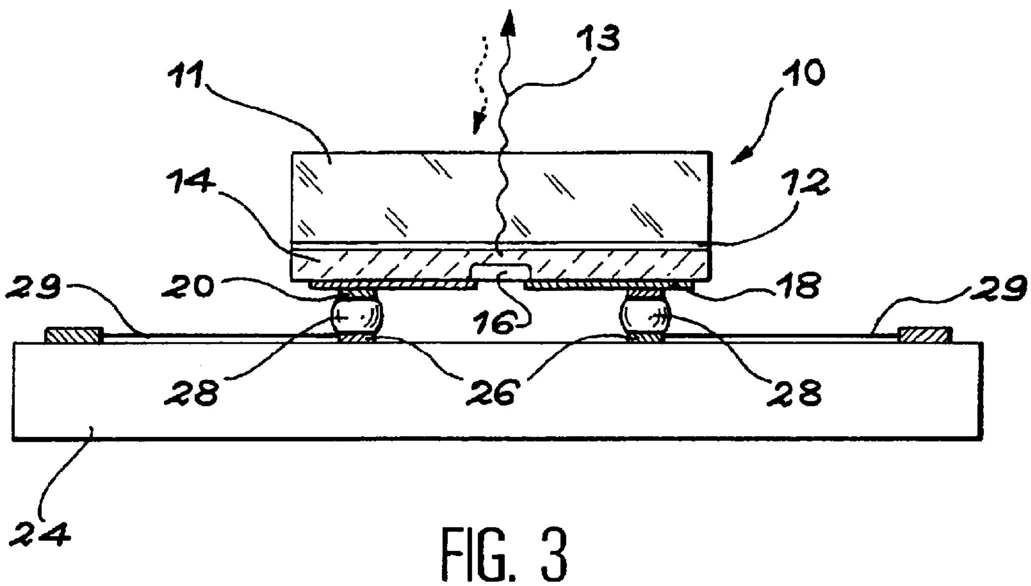

A second stage is shown schematically in FIG. 3. In this second stage, using the flip chip method, the component 10 is transferred onto the control circuit 24 which for example may be an interconnection network or an active circuit, for example, in silicon or GaAs.

It can be seen that the contacts 20 are connected respectively to other electrically conducting contacts 26 formed in the control circuit, this connection being produced using solder balls 28.

Also, it can be seen that the active zone 16 is alongside the control circuit and that the light emitted or detected by this active zone has to cross the epitaxial layer 14 and the etch stop layer 12.

Also, identified in FIG. 3 are the conducting lines 29 making up the control circuit 24 and their connections to the contacts 26.

Hence a light emitting or detecting component is available from the rear face, i.e. the face opposite the side where the active zone 16 is located.

Figure 4:
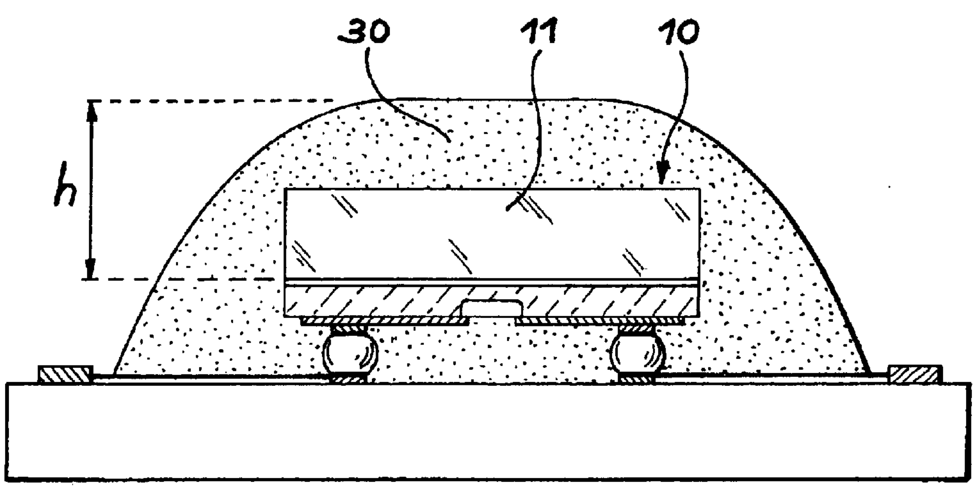

In a third stage, for which the object is to create a coating with a minimum height above the etch stop layer and which is shown schematically in FIG. 4, the component is coated using a resin coating 30.

In the example given in FIG. 4, the coating is completely applied.

The resin coating 30 penetrates beneath and around the component by way of capillary action. It completely coats the substrate 11. It is to be noted that the height of the resin coating h (h>0) is measured from the upper face of the etch stop layer.

Such a technique is described in the reference document [6].

It is useful to note that the VCSEL component can be transferred using another technique other than the flip-chip technique, for example using an anisotropic adhesive, electrically conducting polymer balls or even a hybridisation using a pre-bond.

Figure 5:
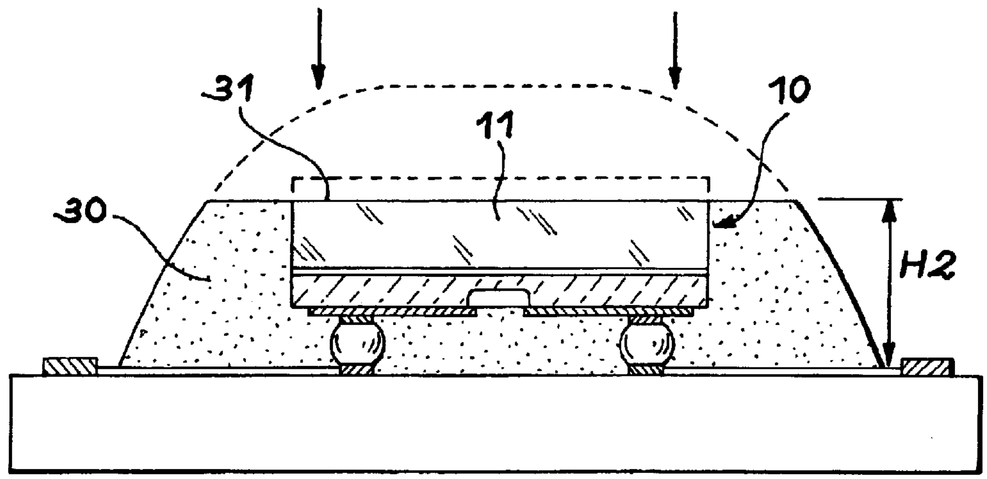

A fourth stage is shown schematically in FIG. 5 and consists of a recess produced by polishing or mechanical thinning in the upper face 31 of the component 10.

The resin coated component is polished mechanically in order to simultaneously remove the resin coating 30 and a part of the substrate 11 over a certain thickness, until the height of the thus mechanically polished component attains a predetermined value H2 (measured from the circuit 24).

Figure 6:
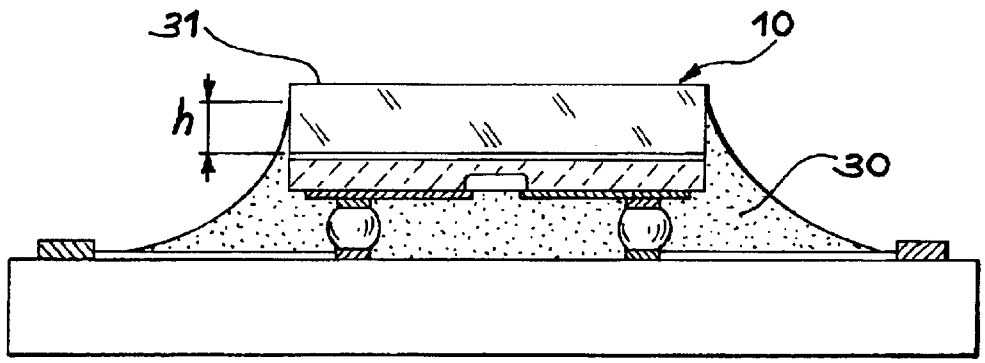
FIG. 6 shows schematically a variation of the stages shown in FIGS. 4 and 5, FIGS. 7 and 8 show schematically other stages of this process according to the invention.

In the example at FIG. 6, the component 10 is only partially coated, as the resin coating 30 does not cover the upper surface of the component. This is known as under filling.

The stage shown in FIG. 5 is thus optional in the situation where the coating resin does not cover the upper surface of the component.

Figure 7:
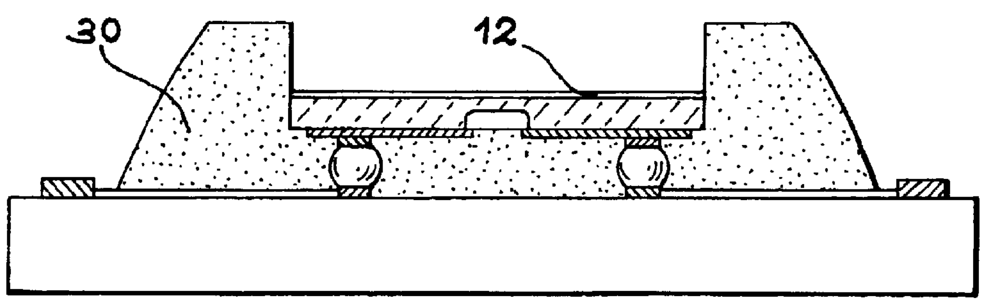

In a fifth stage, as shown schematically in FIG. 7, the component substrate is chemically etched.

The previous stage reveals the rear face of the substrate after removal of the resin coating. Thus a chemical etch is used (by using an appropriate liquid or a plasma). This etch removes the remaining substrate as far as the etch stop layer leaving undisturbed the inner surface of the resin coating.

This chemical etch thus has to operate selectively with respect to the etch stop layer and the coating resin i.e. able to remove the substrate without removing the etch stop layer nor the coating resin.

Figure 8:
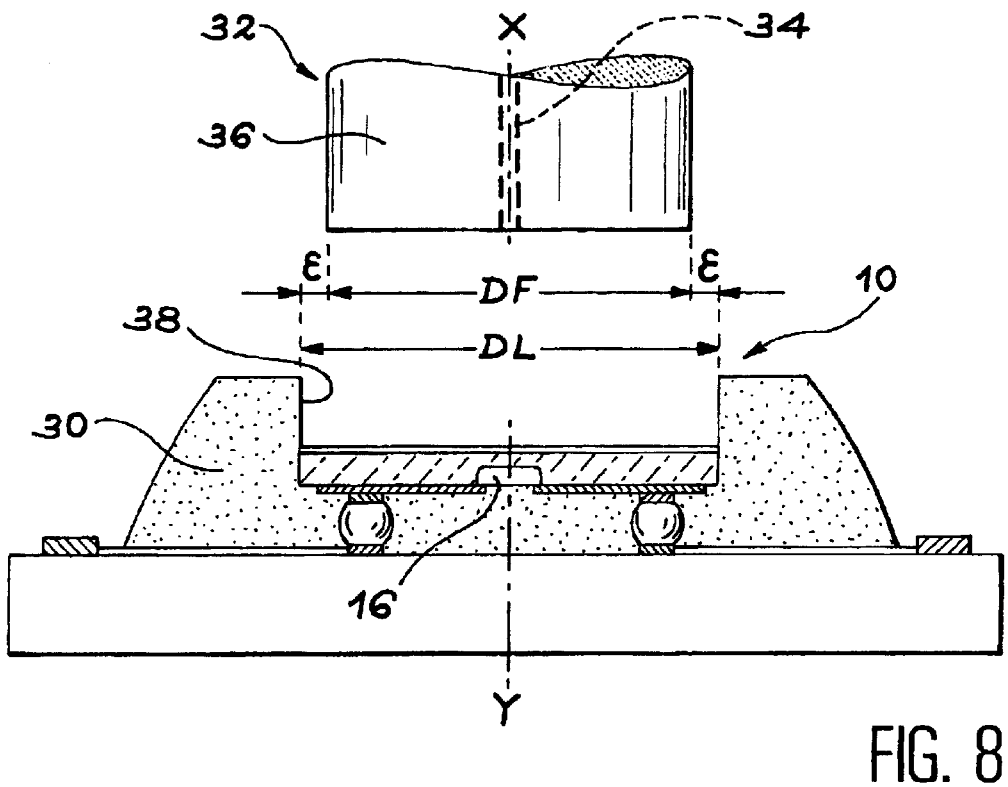

The sixth stage is shown schematically in FIG. 8.

Shown in this FIG. 8, in a longitudinal section, is the optical fibre 32 that is to be aligned with the component 10, i.e. that is to be coupled optically to the active zone 16 of this component.

The optical axis of this fibre or more precisely the optical axis of the core 34 of this fibre is denoted by X. The diameter of the fibre or more precisely the diameter of the optical cladding 36 of the fibre is denoted by DF. The optical axis of the component, i.e. the optical axis of the active zone of this component is denoted by Y. The aim is to align both axes X and Y.

In FIG. 8, the value $\epsilon$ is equal to half the difference between DL and DF.

In the sixth stage, the optical fibre is aligned opposite the cavity 38, which results in the removal of substrate. Thus the fibre can be inserted into this cavity.

Initially it is possible to coat the end of the fibre that is to be inserted into the bottom of the cavity with an adhesive, for example a polymerisable adhesive of the type that responds under the application of ultraviolet radiation.

The fibre is inserted into the cavity with an alignment error $\epsilon$ between the core and the active zone of the VCSEL.

Figure 9:
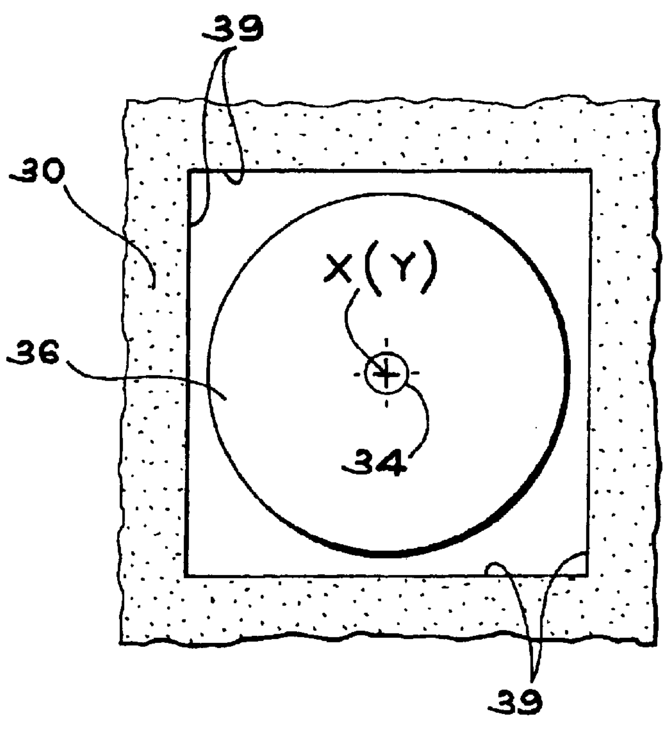
FIG. 9 is a view from above of FIG. 8.

FIG. 9 is a view from above of FIG. 8.

An alignment accuracy between the fibre and the component is thus obtained if:

- the optical center (optical axis Y) of the component is perfectly centered with respect to the edges 39 of the moulding created using the resin 30 (it will be shown later that the required accuracy can be perfectly controlled)
- the core of the fibre is perfectly centered with respect to the periphery of the optical cladding of this fibre.

After inserting the fibre into its socket, i.e. into cavity 38, it simply remains to cure the adhesive (for example if the adhesive is the type that polymerises under the application of ultraviolet radiation, then by the use of ultraviolet light).

Figure 10:
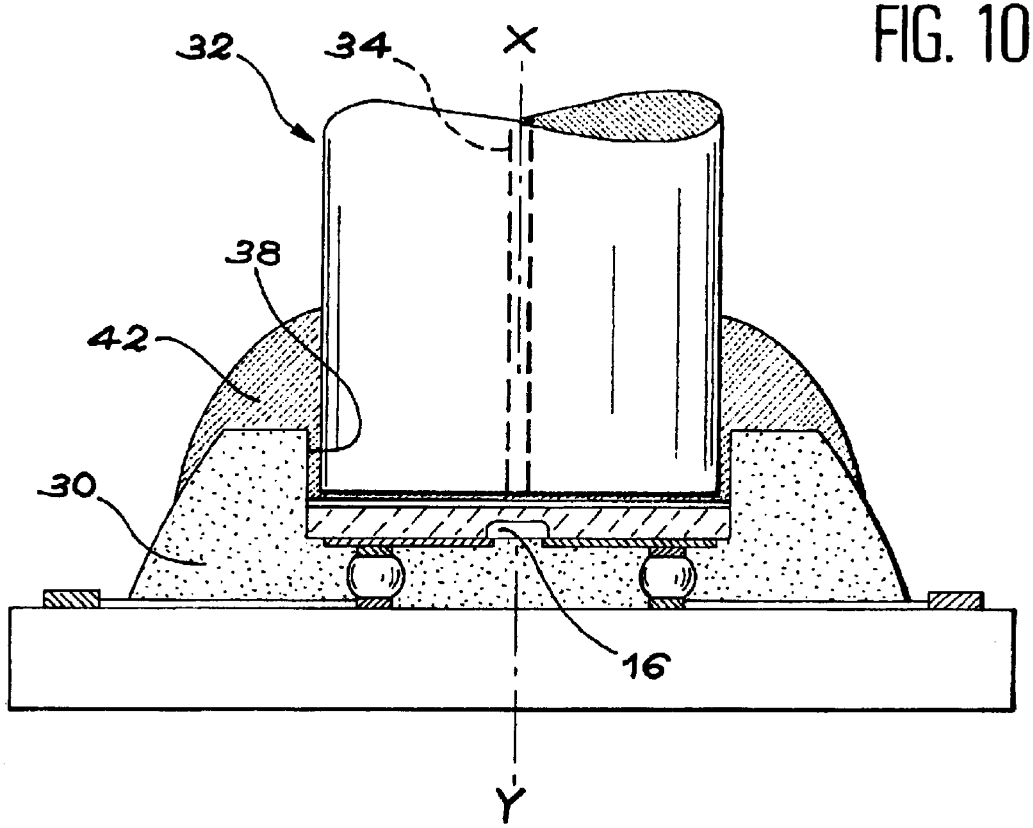
FIG. 10 is a schematic view of an assembly produced using the process according to the invention.

FIG. 10 shows schematically a seventh stage in the process according to the invention, that produces a device in accordance with the invention in which the optical fibre 32 is inserted into the cavity 38 and firmly connected to the component 10.

To achieve this an adhesive 42 is added to provide good rigidity of the optical connection produced. This adhesive covers the coating resin 30 and covers the optical fibre 32.

It should be noted that the use of an adhesive that polymerises under ultraviolet radiation as described above means that any misalignment during the curing of the fixing adhesive 42 is avoided.

The conditions needed for a good alignment between the fibre and the VCSEL obtained by cutting the semiconducting wafer (FIG. 2) will be described as follows.

The accuracy with which the face of the optoelectronic component is cut dictates the accuracy of the value DL as shown in FIGS. 2 and 8.

In effect, the coating resin 30 constitutes a reverse moulding of the optoelectronic component or chip. The width of the cavity 38 (length of the edge of the cavity) is thus equal to the width of this chip after being cut.

Cutting a chip to a dimension of DL±μm or better is easy to achieve when measured using fiducial/alignment patterns. Thus it is possible to obtain an accuracy of better then 5 μm on the value of the centered reverse moulding with respect to the optically active zone 16.

The accuracy of location of the core of an optical fibre with respect to the center of this fibre is better than 5 μm.

Thus it may be concluded that the alignment of the core 34 of the fibre with the active zone 16 of the optoelectronic component can easily be better than 10 μm, which enables a passive attachment between the optoelectronic component and the optical fibre to be made with an accuracy better than 10 μm and without any special alignment fixture.

The condition needed for an alignment between an optical fibre and a VCSEL component using etching of the optoelectronic component will now be considered.

The above description uses the component itself, after moulding into an alignment guide (the lateral cut faces of this component).

The diameter of the optical fibre could be 125 μm which will require the use (hybridisation) of an optoelectronic component with an edge length of 125 μm.

In the case where larger optoelectronic components are involved and/or to produce a V shaped groove as a better mechanical guide for the fibre, the following process according to the invention is used.

The previously described stages are retained. Only the preparation of the optoelectronic component 10 shown in FIG. 2 differs.

Figure 11:
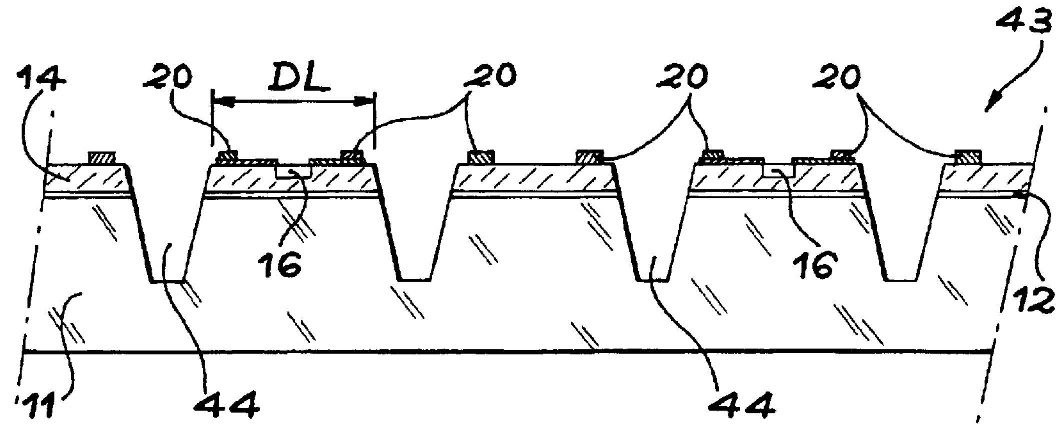
FIG. 11 is a schematic view of an optoelectronic component used in the invention, comprising several active zones.

This component is replaced by the optoelectronic component 43 which is shown schematically in FIG. 11, (noting however that, in the example of FIG. 11, a component with a number of active zones 16 is considered). The component in FIG. 11 also includes the substrate 11 on which is formed the etch stop layer 12 as well as the layer 14 or active layer, formed on this etch stop layer and which contains each of the individual zones 16 or active zones, to be used as light emitters or detectors.

This active layer is also provided with electrically conducting contacts 20, used to bias the component.

It can be seen that the component 43 is deeply etched from the free surface to the active layer 14. Thus a channel 44 is formed around each of the active zones 16 of the component.

In the given example, this channel 44 is in the shape of a V when the component is viewed in longitudinal section.

Returning to the etching of the component 43. The manufacture of such a component or optoelectronic chip will now be described.

During the design of a manufacturing technology of such chips on a semiconducting wafer, each of the deep channels is produced. They must be of a controlled shape such that the opening has an internal diameter equal to DL in order to allow later the alignment of an optical fibre and the active zone 16 of the component 43, this zone being surrounded by this channel.

In fact, to obtain a V shaped channel that will easily guide the fibre at the final assembly stage.

The depth of this channel may vary from 15 μm to more than 100 μm depending upon the alignment conditions required.

The wafer thus produced is then cut into individual optoelectronic chips. Each chip may comprise (as is the case with FIG. 11) several optical pixels. Hence strips and even matrices of optical pixels can be produced.

Figure 12:
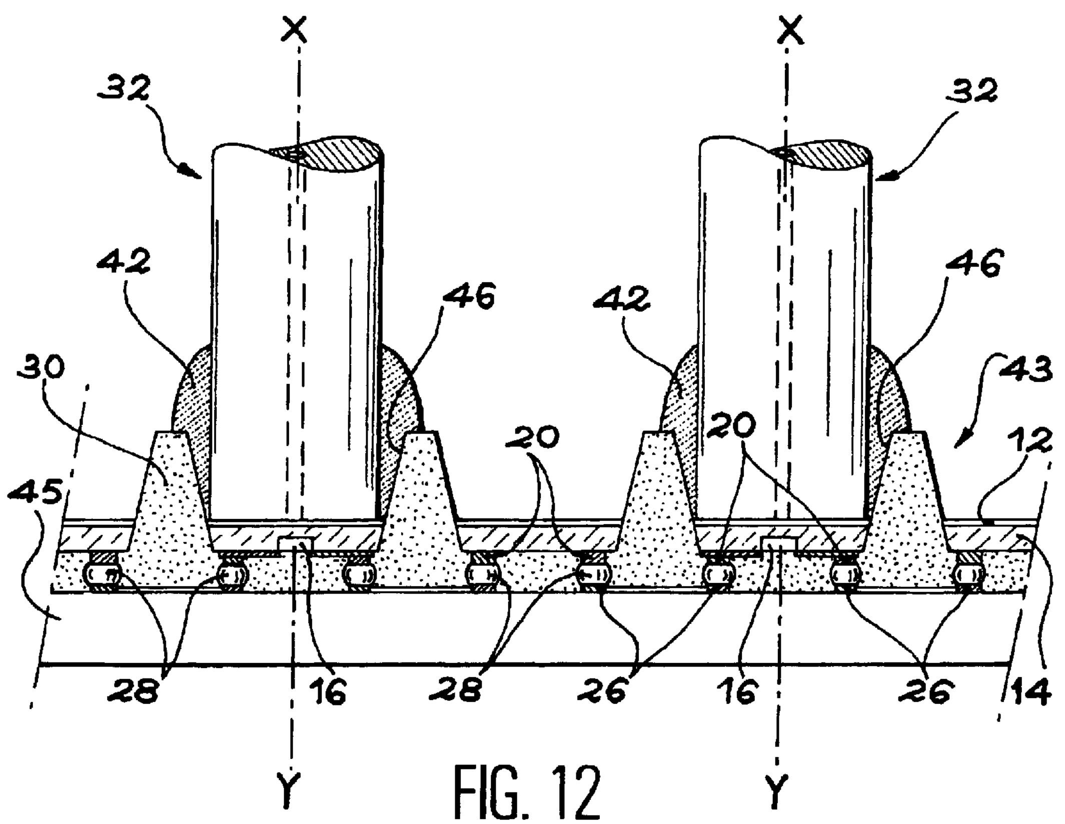
FIG. 12 is a schematic view of an assembly of optical fibres and the component in FIG. 11, and FIGS. 13 to 15 are schematic views of assemblies of optical fibres and optoelectronic components, obtained in accordance with the invention.

By reference to FIG. 12, the manufacture of the optoelectronic device in accordance with the invention using the component 43 in FIG. 11 is now considered. The manufacture is comparable to that described previously. On a control circuit 45 the optoelectronic chip described above is hybridised and stages similar to the second to the seventh described earlier are performed. The manufacturing approach is collective.

Also it is possible to use a component comprised of a strip or a matrix of active zones and connect it to a ribbon or a number of optical fibres arranged into a bundle.

Returning to FIG. 12, optoelectronic component 43 comprising several active zones 16 as well as the resin coating 30 that enables the cavities 46 that are to respectively take the optical fibres 32 can be seen. Each cavity constitutes a mechanical alignment guide.

Each active zone 16 of the component is centered in the cavity it corresponds to, where the optical axis Y of this active zone constitutes the axis of the cavity.

In each cavity an optical fibre is inserted 32 with its axis X aligned with the Y axis of the corresponding active zone.

Each optical fibre is further held in place with respect to the corresponding cavity by means of a layer of adhesive 42, for example a glue that can be polymerised by the use of ultraviolet radiation.

It is to be noted that the optical component is electrically connected to the control circuit 45 by the use of solder balls 28 that connect the electrical contacts 20 used to wire in its component 43 to the electrical contacts 26 used to wire in the control circuit.

Thus it is possible to control the different active zones of the component.

The advantages of the embodiment of the invention that uses channels are now explained.

This embodiment allows the optoelectronic chips to be easily handled prior to cutting, hybridisation and coating, the size of the component being far greater than the diameter of an optical fibre.

Because the alignment is achieved using a photolithographic technique to produce the channels, this embodiment also enables a more accurate alignment between an alignment guide and an optical beam to be achieved than is possible when using a cutting technique (FIG. 2).

This embodiment moreover allows a reduction in the number of hybridisations needed to assemble the bundle of fibres (grouping of processes at optoelectronic chip level).

It is to be noted that the present invention can be applied to components other than emitting components (LED, VCSEL for example) or photodetecting components (PIN photodiode, MSM for example). Passive components (lenses, mirrors, filters, networks . . . ) can also accommodate such alignment methods.

An extension of the invention to a group of assemblies will now be explained. In effect, the invention is applicable for the production of parallel cables of the ribbon or matrix type.

For example, instead of hybridising one optoelectronic component to a control circuit, it is easy to hybridise several optoelectronic components to the same control circuit. This is shown schematically in FIG. 13.

Figure 13:
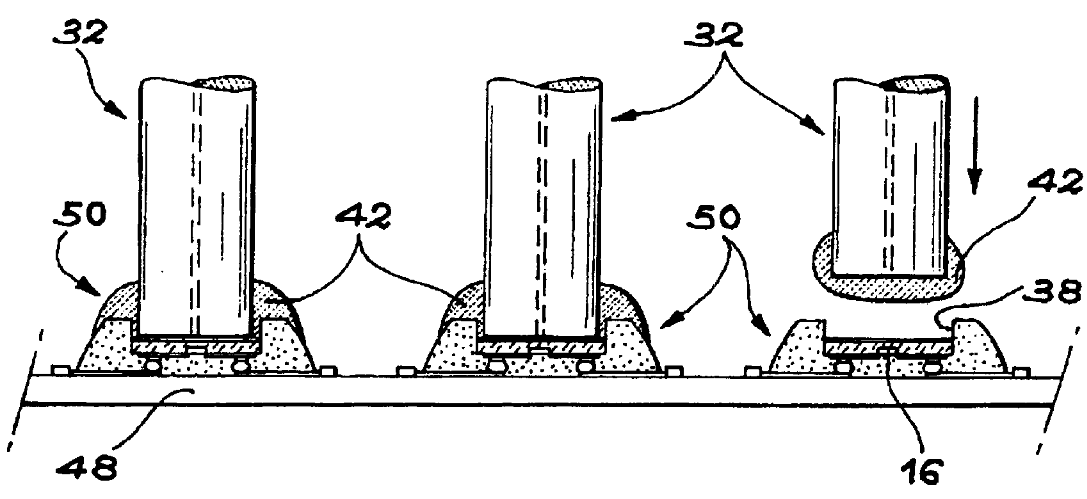

In this FIG. 13 can be seen a control circuit 48 to which are hybridized several optoelectronic components 50, each of these components comprising an active zone 16. Also apparent are the optical fibres 32 fixed respectively into the cavities 38 of these components, cavities that are centered respectively on the corresponding active zone 16.

Also the layers of adhesive 42 that hold the optical fibres in place with respect to the corresponding components can be seen.

One of the optical fibres 32 is in the process of being attached into a cavity 38 of a component 50. This optical fibre has at one end some adhesive 42 that will be used to firmly hold it in place with respect to the component.

According to the invention several optoelectronic components can be hybridised to a whole wafer of control circuits.

The common assembly process which is the object of the invention can thus be considered under two headings:

- common assembly from the point of view of the optical wafer (variation using a deep channel)
- common assembly from the point of view of the control circuit (assembly on a chip or on a wafer of control circuits).

Some numerical examples are now considered.

A first example concerns the coupling of an optical fibre of 125 $\mu$m diameter to a VCSEL laser device. A wafer of VCSEL laser devices is made and then cut accurately into single 125 $\mu$m edge size chips. Using the described process a laser chip is coupled to a control circuit (or several laser chips to a single control circuit with several control functions). The optoelectronic chips must be handled very carefully during the cutting and hybridisation operations.

A second example concerns the coupling of a matrix of 5×5 optical fibres to a single control circuit. Onto a semi-conducting wafer a matrix of VCSEL laser devices is formed with a pitch of 500 $\mu$m and the lasers are encircled with channels of 125 $\mu$m side dimension. The size of the chip obtained is 3×3 mm. Such a chip is easy to handle using the process described above.

It is possible to directly hybridise to a silicon wafer of 100 mm, or 150 mm diameter, all the chips and to introduce collectively a process in accordance with the invention on a wafer of silicon.

Figure 14:
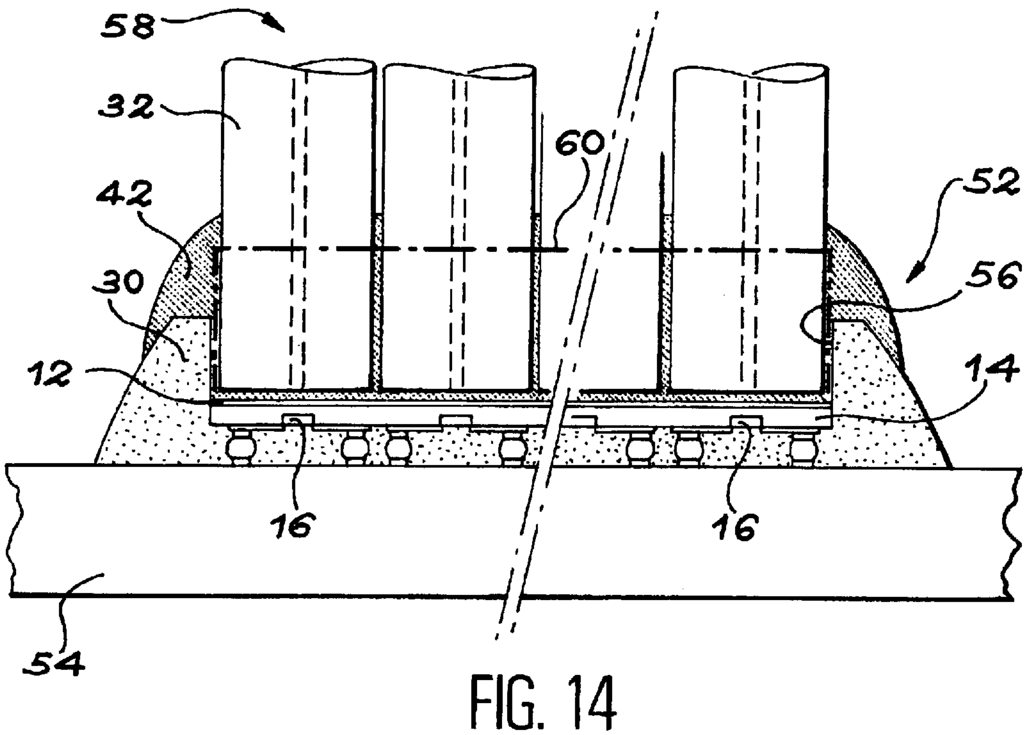

FIG. 14 shows schematically another example of the invention in which an optoelectronic component 52 comprising several active zones 16 is manufactured. The layer 14 can be seen where these active zones are located and above which the etch stop layer 12 is located.

The control circuit 54 to which is hybridised the component 52, and the layer 14 containing the active zones alongside the control circuit can also be seen.

As previously, the component has been coated in a layer of resin coating 30, then the component has been thinned using a mechanical technique, then the substrate from which the component has been made has been removed.

Thus the cavity 56 that can be seen in FIG. 14 is achieved. In this example, the cavity 56 is made to receive the end of a group 58 of optical fibres 32 with parallel ends held firmly together using an appropriate connector 60. This connector is inserted into the cavity and then located firmly using a layer of adhesive 42 as described earlier.

Figure 15:
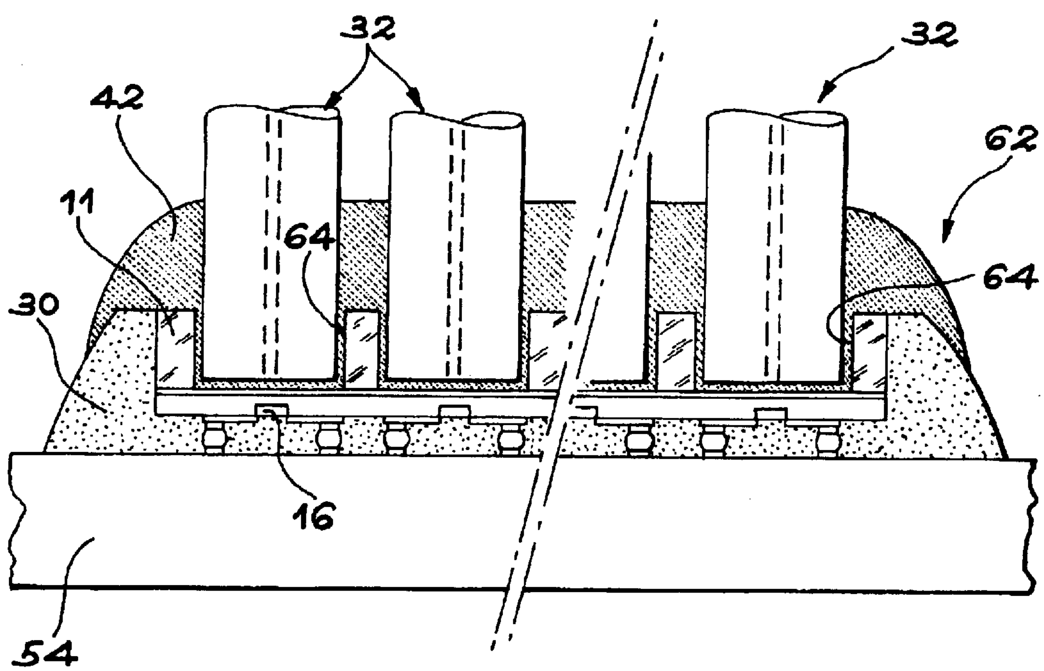

The example of the invention that is shown schematically as a longitudinal section in FIG. 15 is different from that shown in FIG. 14 since in the example of FIG. 15, not all the substrate 11 is removed.

More precisely, instead of chemically etching this substrate as explained above in the example of FIG. 7, a mask which is not shown is used in conjunction with a photolithographic technique to make parallel cavities 64 through the substrate and which are centred centered respectively on the active zones 16 of the optoelectronic component 62 in FIG. 15. Each cavity has, when viewed from above, the shape of a square with the side length equal to the diameter of the optical fibres that are to be coupled optically to the active zones.

The cavities thus act as mechanical guides for the fibres that can be held firmly in place with an appropriate adhesive 42, with respect to the component 62, after each fibre has been inserted into the corresponding cavity.

For FIGS. 14 and 15 it is to be noted that, the electrical connections of circuit 54, being of the type shown as 29 in FIG. 3, are arranged perpendicularly to the plane of these FIGS. 14 and 15 and thus cannot be seen.

The present invention has various advantages. In particular it avoids the use of an alignment support and the likelihood of location errors that such a support could introduce. It provides a high density integration alignment device. The cost of using it is reduced. The process which is the subject of the invention lends itself readily to common assembly applications.

The list of documents that follows are all referred to in this description:

(1) Use of silicon Vee groove technology in the design and volume manufacture of optical devices, R. Cann et al., SPIE, vol. 3004, p.170 to 173

(2) Optical module and a fabrication thereof, U.S. Pat. No. 5,853,626, M. Kato (3) Flip-chip bonded, back-emitting microlensed arrays of monolithic vertical cavity lasers and resonant photodetectors, C. A. Coldren et al., IEEE 1999 Electronic components and technology conference, p. 733 to 740

(4) Low cost, free-space optical interconnects, A. Duane et al., Compound semiconductor, December 1998, p.11 to 13

(5) VCSEL electrical packaging analysis and design guidelines for multi-GHz applications, IEEE Trans. On components, packaging and manufacturing technology—Part B, vol. 20, n°. 3, August 1997, p.191 to 196

(6) Process for coating electronic components hybridized by bumps on a substrate, U.S. Pat. No. 5,496,769 F. Marion and M.Boitel, see also FR 2 704 691.

What is claimed is:

1. A passive alignment process of at least one optical fiber (32) and at least one optoelectronic component having at least one active zone (16), the process being characterised in that:

at least one optoelectronic component (10, 50, 43, 52, 62) is used which comprises a layer of a substrate (11), a first layer (12) for resisting the removal of the substrate and a second layer (14) comprising at least one active zone, the active zone being opposite a portion of the first layer and used to emit or detect a light beam crossing the portion, the first layer being transparent to the light beam, the optoelectronic component is placed on a support (24, 48, 45, 54) such that the second layer is opposite the support, the optoelectronic component is at least partially coated with a coating material (30) extending from the support as far as a level beyond the first layer, and at least a portion of the substrate and the coating material located above the substrate is selectively removed as far as the first layer, the removal taking place opposite the active zone and exposing, opposite the active zone, a cavity able to accommodate an end of at least one optical fiber and enabling the optical fiber to be aligned with the optoelectronic component by insertion of the end into the cavity.

2. The process according to claim 1, in which the removal of at least a part of the substrate (11) comprises an etching of the substrate, and the first layer (12) is an etch stop layer.

3. The process according to claim 1, in which the support comprises an electrical circuit (29) to which the optoelectronic component is connected.

4. The process according to claim 1, in which moreover the end of the optical fiber (32) is inserted into the cavity and the optical fiber is held firmly with respect to the optoelectronic component.

5. The process according to claim 1, in which prior to being placed on the support (24), the optoelectronic component (10) is bounded by planes perpendicular to the first and second layers (12, 14), these planes surrounding a region of the substrate where the cavity will later be made.

6. The process according to claim 1, in which prior to placing the optoelectronic component on the support, a channel (44) is formed around the active zone (16), from the free surface of the second layer as far as the substrate, the walls of the channel closest to the active zone surrounding a substrate region where the cavity will later be made.

7. The process according to claim 6, in which the channel (44) is bounded by two walls that become closer together towards the bottom of the channel.

8. The process according to claim 1, in which the optoelectronic component (10) is completely coated with the coating material (30), said coating material then being removed together with the substrate (11) to a level beyond the first layer (12).

9. The process according to claim 1, in which the optoelectronic component (10) is partially coated with the coating material (30) to a level beyond the first layer.

10. The process according to claim 1, in which the optoelectronic component (10) comprises a single active zone (16) at the center of the component, the substrate when viewed in a plane parallel to the first and second layers, forms a square of side length equal to the diameter of the optical fiber, all the substrate of the component is removed as far as the first layer of the component in order to form a cavity and the end of the optical fiber (32) is inserted into said cavity with the cavity acting as a guide for the end.

11. The process according to claim 1, in which the optoelectronic component (52) comprises a plurality of active zones (16), all the substrate of the component is removed as far as the first layer of the latter in order to form a cavity (56) and the ends of a plurality of parallel optical fibers (32) are inserted into the cavity, held together firmly with respect to each other using a holding arrangement (60), the cavity being able to guide the holding arrangement, the active zones being intended to be respectively coupled optically to the ends of the optical fibers.

12. The process according to claim 1, in which the optoelectronic component (62) comprises a plurality of active zones (16), a plurality of portions of the substrate (11) of the component are removed to form a plurality of parallel cavities (64) respectively facing the active zones, the cavities being able to guide the ends of a plurality of optical fibers (32), the active zones being intended to be respectively coupled optically to the ends of the optical fibers.

13. The process according to claim 1, in which the optoelectronic component comprises a plurality of active zones (16) intended to be optically coupled to the ends of a plurality of optical fibers (32) which are firmly held together.

14. The process according to claim 1, in which a plurality of optoelectronic components (50) are used and the components are located on a single support (48).

15. The process according to claim 1, in which each optoelectronic component is a vertical cavity surface emitting laser.

16. A passive device for the passive alignment of at least one optical fiber (32) and at least one optoelectronic component (10, 50, 43, 52, 62), the device being characterised in that the optoelectronic component comprises a layer (14) and, in the layer, at least one active zone (16), the active zone being able to emit or detect a light beam, the optoelectronic component being placed on a support such that the layer is facing this support, moreover the component comprising at least one layer which, on one hand, is inserted between the optoelectronic component and the support and, on the other hand, forms a cavity, said cavity being above the component and facing the active zone and being able to accept an end of at least one optical fiber and to enable the alignment of the optical fiber and the optoelectronic component by inserting the end of at least the optical fiber into the cavity, by optically coupling the end to the active zone.

17. The device according to claim 16, in which the optoelectronic component comprises a single active zone (16) and a single cavity on the active zone, the cavity being able to guide the end of the optical fiber (32) in order to optically couple the end to the active zone.

18. The device according to claim 16, in which the optoelectronic component comprises a plurality of active zones (16) and a number of parallel cavities (64), each centered respectively on the active zones, the cavities being able to guide the ends of a plurality of optical fibers (32) in order to optically couple respectively the ends to the active zones.

19. The device according to claim 16, in which the optoelectronic component comprises a plurality of active zones (16) and a single cavity (56) facing the active zones, the cavity being able to guide an arrangement (60) for holding parallel ends of optical fibers (32), that are to be optically coupled respectively to the active zones.

* * * * *